United States Patent [19]
Raza

[11] Patent Number: 5,973,545
[45] Date of Patent: Oct. 26, 1999

[54] SINGLE PUMP CIRCUIT FOR GENERATING HIGH VOLTAGE FROM TWO DIFFERENT INPUTS

[75] Inventor: S. Babar Raza, Sunnyvale, Calif.

[73] Assignee: Cypress Semiconductor Corp., San Jose, Calif.

[21] Appl. No.: 08/911,209

[22] Filed: Aug. 14, 1997

Related U.S. Application Data

[63] Continuation of application No. 08/597,849, Feb. 7, 1996, abandoned.

[51] Int. Cl.$^6$ ........................................................ G05F 1/10
[52] U.S. Cl. ............................... 327/536; 363/60; 307/110
[58] Field of Search ..................... 327/536, 148, 327/157; 363/59, 60; 331/8, 10, 14, 17; 307/109, 110

[56] References Cited

U.S. PATENT DOCUMENTS

| | | |
|---|---|---|
| 4,839,787 | 6/1989 | Kojima et al. ............................. 363/60 |
| 4,922,402 | 5/1990 | Olivo et al. ............................... 363/60 |
| 4,962,512 | 10/1990 | Kiuchi ....................................... 377/78 |
| 4,970,409 | 11/1990 | Wada et al. ............................. 327/541 |
| 5,059,815 | 10/1991 | Bill et al. ................................ 327/536 |
| 5,339,236 | 8/1994 | Tamagawa ................................ 363/59 |
| 5,483,486 | 1/1996 | Javanifard et al. ................ 365/185.17 |
| 5,535,160 | 7/1996 | Yamaguchi ........................ 365/189.01 |
| 5,543,668 | 8/1996 | Fong ....................................... 307/110 |
| 5,574,634 | 11/1996 | Parlour et al. ............................ 363/59 |
| 5,745,354 | 4/1998 | Raza ........................................ 363/60 |

Primary Examiner—Kenneth B. Wells
Attorney, Agent, or Firm—Christopher P. Maiorana, P.C.

[57] ABSTRACT

A single pump circuit for generating a variable high voltage that responds to more than one discrete input. The present invention uses a common pump circuitry to process a number of voltage inputs. Each of the voltage inputs can be a different input voltage and will be stepped up to a higher output voltage according to the design constraints of the pump circuitry. Since the pump circuitry is used for each of the inputs, without redundancy, the amount of chip real estate consumed is minimized. A switching system is implemented that detects which input has a voltage present and activates a particular path to the pump output accordingly.

20 Claims, 4 Drawing Sheets

SINGLE PUMP CIRCUIT FOR GENERATING HIGH VOLTAGE FROM TWO DIFFERENT INPUTS

This is a Continuation of U.S. patent application Ser. No. 08/597,849, filed Feb. 7. 1996, now abandoned.

The present application may relate to U.S. application Ser. No. 08/627,250.

FIELD OF THE INVENTION

This invention relates to high voltage pump circuits generally and more particularly to a single pump circuit for generating a variable high voltage output from more than one discrete input.

BACKGROUND OF THE INVENTION

An electrically programmable ROM (EPROM) implements non-volatile storage of data using a storage transistor having a so-called floating gate. The storage transistor, or memory cell, is programmed by having hot electrons injected into a floating gate to cause a substantial shift in the threshold voltage of the storage transistor. This technique is generally termed hot electron tunneling. Under high gate and high drain voltages, electrons gain sufficient energy to jump the silicon-silicon dioxide energy barrier, penetrating the oxide and flowing to the floating gate, which is completely surrounded by oxide.

To implement the hot electron tunneling during the programming process, a voltage higher than the input voltage is required. To generate the high voltage necessary to realize the high current path, a pump circuit is generally implemented.

Another technique, FN tunneling, is a quantum-mechanical effect which allows electrons to pass through the energy barrier at the silicon-silicon dioxide interface. While the energy required for the electrons to pass this barrier is much lower than the energy required for hot electron injection programming, a pump circuit is still generally required.

It is well known to produce a pump that generates a high voltage pump output from a single input. Generally, if more than one input is required to generate high voltage pump outputs, separate pump circuits would be required. The implementation of separate pump circuits would require more chip real estate, which is generally undesirable with the goal of efficient use of device area. This is particularly true in very large scale integration (VLSI) technology.

FIG. 1 is a prior art scheme showing a single input used to generate a high voltage pump output. The pump 10 generally comprises an input Vpp, an oscillator input Ph and a output Pumpout. The pump 10 generally takes the input Vpp and increases it by a predetermined voltage amount to produce the output Pumpout.

FIG. 2 is a more detailed block diagram of a prior scheme showing a single input used to generate a high voltage output Pumpout. The pump 10 generally comprises an initialization circuit 11, an oscillator circuit 12 and a clamp circuit 13. The oscillator circuit 12 is shown as having two inputs PhA and PhB. The dual oscillator inputs PhA and PhB generally provide the best results. The initialization circuit 11 provides information that is used by the oscillator circuit 12 to initialize the internal nodes of the pump. The clamp block 13 prevents the output Pumpout from exceeding the voltage to be greater than the desired voltage.

FIG. 3 is a prior art scheme showing the circuitry used to generate a high voltage pump output from a single input. The pump 10 generally comprises an input PhA, an input PhB, an input Vpp and an output Pumpout. The pump 10 generally comprises a capacitively coupled transistor 14, a capacitively coupled transistor 15, a transistor 16, a transistor 18, a transistor 20, a transistor 22, a transistor 24, a transistor 26, a transistor 30 and a transistor 32. The input PhA is an oscillator input that is capacitively coupled through transistor 14 to both the drain and the gate of the transistor 18. The input PhB is an oscillator input that is capacitively coupled through transistor 15 to both the drain and the gate of the transistor 20. A single oscillator input could be used in place of the input PhA and PhB. However, it is generally accepted by those skilled in the art that a dual oscillator input configuration provides better results. On the positive cycle of the oscillation of the input PhA, the capacitively coupled transistor 14 pumps the voltage that is presented to the capacitively coupled node A. A similar charging occurs with input PhB and capacitively coupled transistor 15 on node B. The transistors 16, 18, 20, 22, 24, 26, 30 and 32 are each configurated as diodes since either the source or drain is coupled directly to the gate. The drains of the transistors 16, 18 and 20 are cascaded together. The drain of the transistor 16 receives an input from the input Vpp. The source of the transistor 20 is connected to the output Pumpout.

The input PhA is also presented to a capacitively coupled transistor 38. The input PhB is also presented to a capacitively coupled transistor 36. An output of the capacitively coupled transistor is presented to both the drain and the gate of the transistor 24 on node C. The output of the capacitively coupled transistor 36 is presented to both the drain and the gate of the transistor 26 on node D. The transistor 22 has a drain that is connected to the input Vpp. The source of the transistor 26 is connected to the output Pumpout. The sources and drains of the transistors 22, 24 and 26 are cascaded together. The transistor 30 receives an input from the input Vpp. The drain of the transistor 32 is connected to the output Pumpout. The drains and sources of the transistors 30 and 32 are cascaded together. The gate of the transistor 30 is connected to both the drain of the transistor 30 and the source of the transistor 32. The gate of the transistor 32 is coupled to the drain of the transistor 32. The input Vpp has three independent paths to the output Pumpout. The first path is through transistor 30 and the transistor 32. The transistor 30 and the transistor 32 provide a clamping effect on the output Pumpout. The voltage across the transistor 30 and transistor 32 is equal to Vpp+2Vtn, where Vtn equals the threshold voltage across a particular transistor 30 or 32. This clamping effect takes place since the transistors 30 and 32 are configured in reverse diode conditions. Effectively, the voltage across the transistors 30 and 32 is limited accordingly. The second path is through the transistor 16, the transistor 18 and the transistor 20. Before the oscillator is turned on the nodes A and C are at Vpp−Vtn and the output Pumpout is at Vpp−3Vtn. When the oscillator turns on the nodes A, B, C and D start pumping higher. The output Pumpout increases in voltage from Vpp−3Vtn and gets clamped by devices 30 and 32 at a voltage Vpp+2Vtn. The devices 16 and 20 are off at this time and the nodes A and C are pumped up to a voltage Vpp+4tn. The nodes B and D are pumped up to a voltage Vpp+3Vtn. It should be appreciated that the capacitively coupled transistors 14, 16, 36 and 38 take up the majority of the chip real estate of the pump circuit 10. To produce a pump circuit 10 that produces a Pumpout in response to more than one input, each of the transistors 14–32 would have to be duplicated for each input. The duplication of the capacitively coupled transistors 14, 16, 36 and 38 would be undesirable in view of the goal of reducing chip real estate.

SUMMARY OF THE INVENTION

The present invention provides a single pump circuit for generating a variable high voltage that responds to more than one discrete input. The present invention uses a common pump circuitry to process a number of voltage inputs. Each of the voltage inputs can be a different input voltage and will be stepped up to a higher output voltage according to the design constraints of the pump circuitry. Since the pump circuitry is used for each of the inputs, without redundancy, the amount of chip real estate consumed is minimized. A switching system is implemented that detects which input has a voltage present and activates a particular path to the pump output accordingly.

Objects, features and advantages of the present invention are to provide a pump circuit for providing a variable high voltage output in response to a number of discrete voltage inputs, minimizing the amount of redundant circuitry present and automatically selecting between the various pump inputs.

DETAILED DESCRIPTION OF THE PREFERRED EMBODIMENTS

Figure 1:
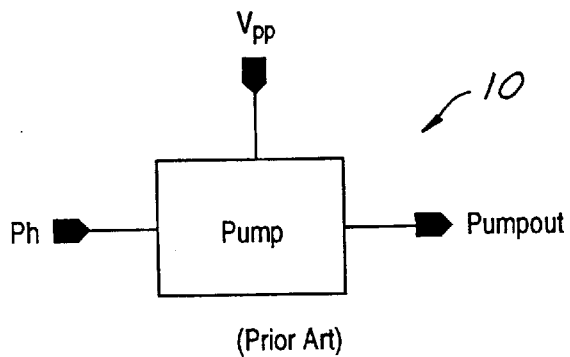
FIG. 1 is a block diagram of a prior art pump scheme illustrating a single input and a single output.
Figure 2:
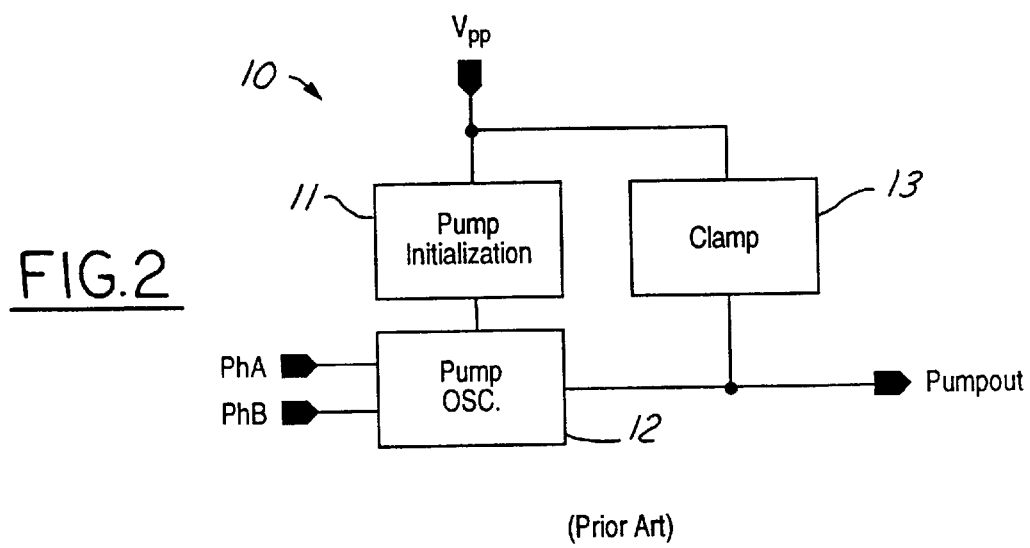
FIG. 2 is a more detailed diagram of a prior art pump scheme illustrating a single input and a single output.
Figure 3:
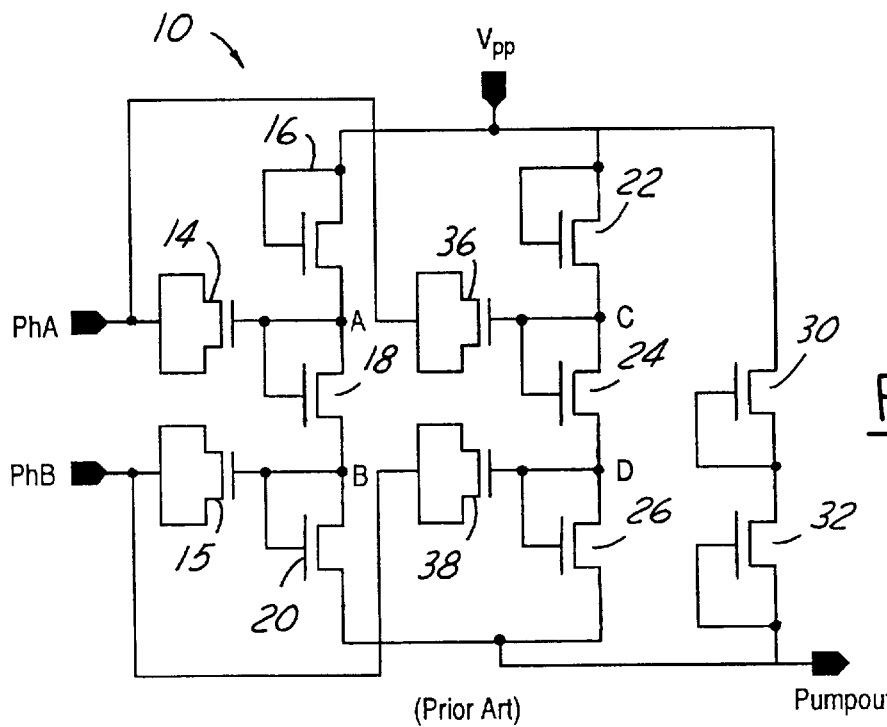
FIG. 3 is an even more detailed block diagram of a prior art pump scheme illustrating a single input and a single output.
Figure 4:
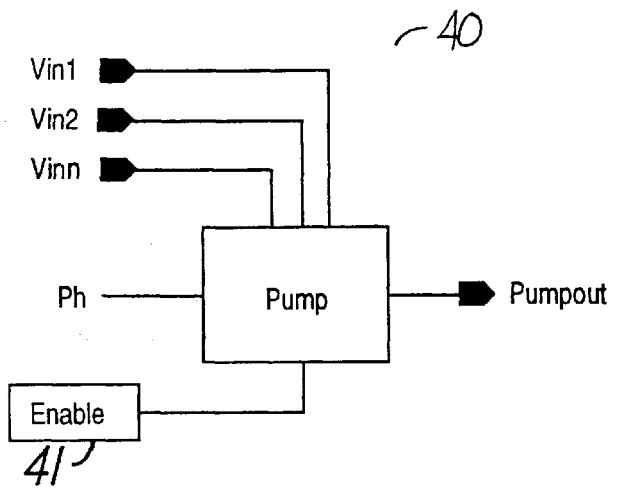
FIG. 4 is a block diagram of the presently preferred embodiment illustrating multiple inputs and single output.

FIG. 4 is a block diagram showing a pump circuit 40 in accordance with the presently preferred embodiment of the invention. The circuit 40 generally comprises an oscillator input Ph, a number of voltage inputs Vin1, Vin2 and Vinn, an enable input 41 and an output Pumpout. The pump circuit 40 looks for a voltage on any of the inputs Vin1, Vin2 or Vinn, increases the voltage by a predetermined amount, and presents the voltage to the output Pumpout. The enable circuit 41 automatically senses which voltage input Vin1, Vin2 or Vinn has a voltage present. The number of voltage inputs Vin1, Vin2 or Vinn can be any number of voltage inputs to fit the design criteria of a particular application. For example, if five different voltage outputs were needed at the Pumpout, the number of voltage inputs could be increased to five. The enable circuit would still automatically sense which voltage is present at an input and adjust the circuit 40 accordingly. It should be appreciated that the input Ph is a single oscillator input. A dual oscillator input, which is well known in the art, could also be substituted for performance reasons.

Figure 5:
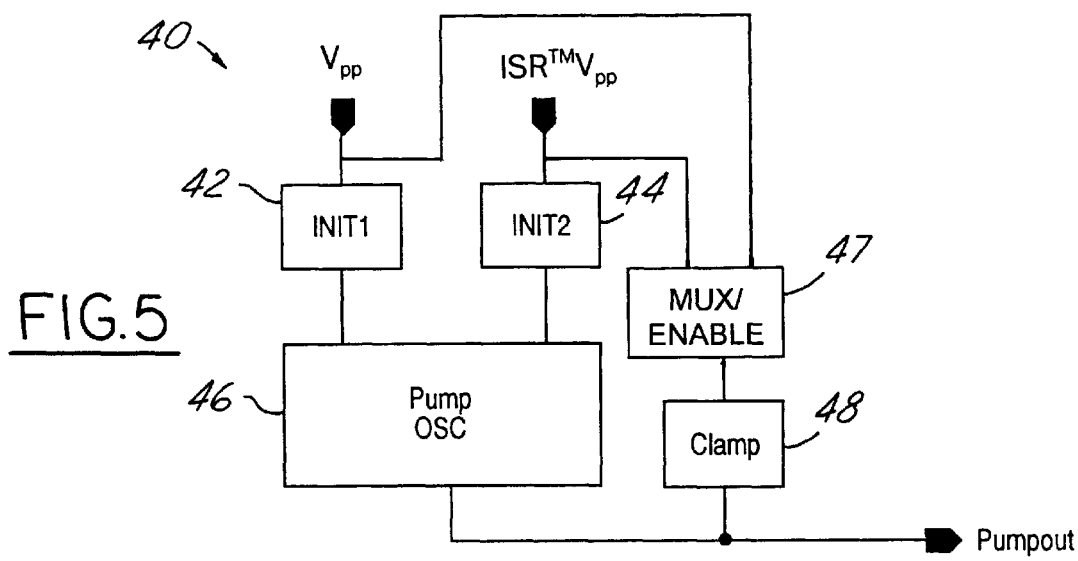
FIG. 5 is a more detailed block diagram of the presently preferred embodiment illustrating multiple inputs and output.

Referring to FIG. 5, a more detailed diagram of the circuit 40 is shown. The circuit 40 generally comprises an input Vppin, an input ISRVpp, (ISR™ is a trademark of Cypress Semiconductor Corporation, San Jose, Calif., referring to an in-system reprogrammable complex programmable logic device) a first initialization circuit 42, a second initialization circuit 44, a pump oscillator 46, a multiplexer/enable circuit 47 and a clamp circuit 48. The inputs Vppin and ISRVpp correspond to the generic inputs Vin1~VinN of FIG. 4. The first or second initialization circuit 42 or 44 senses either an input Vppin, in the case of the first initialization circuit 42, or an input ISRVpp, (ISR™ is a trademark of Cypress Semiconductor Corporation, San Jose, Calif., referring to an in-system reprogrammable complex programmable logic device) in the case of the second initialization circuit 44. The multiplexer/enable circuit 47 selects either the input from the Vppin or the ISRVpp (ISR™ is a trademark of Cypress Semiconductor Corporation, San Jose, Calif., referring to an in-system reprogrammable complex programmable logic device) and presents an output to the clamp circuit 48. The clamp circuit 48 limits the amount of voltage that can be added to either the input Vppin or the input ISRVpp (ISR™ is a trademark of Cypress Semiconductor Corporation, San Jose, Calif., referring to an in-system reprogrammable complex programmable logic device) that is presented to the output Pumpout. The multiplexer/enable circuit 47 also receives signals from the input ISRVpp (ISR™ is a trademark of Cypress Semiconductor Corporation, San Jose, Calif., referring to an in-system reprogrammable complex programmable logic device) and from the input Vppin.

Figure 6:
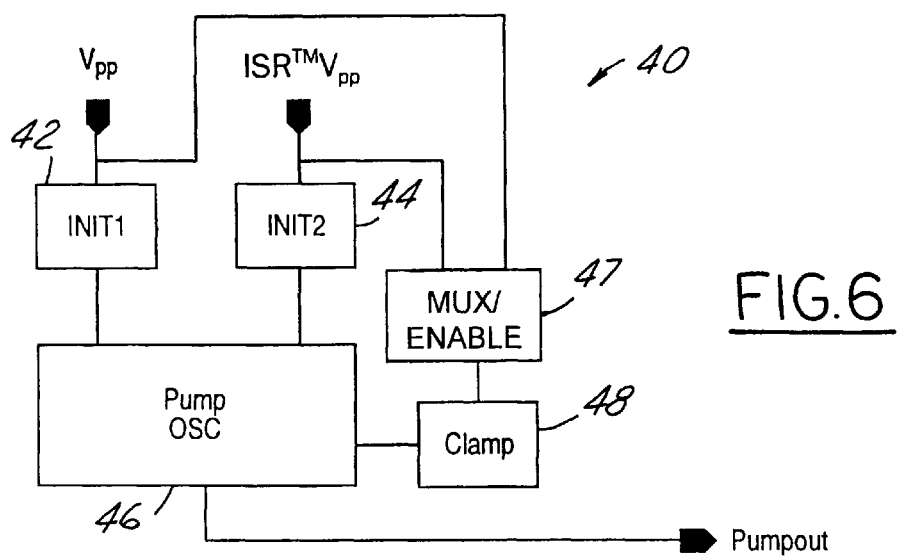
FIG. 6 is a block diagram of the present invention illustrating an alternate clamping configuration.

Referring to FIG. 6, an alternate implementation of the clamp circuit is shown. It should be appreciated that the blocks shown in FIG. 6 are similar to the blocks shown in FIG. 5, with the interconnections being modified such that the clamp circuit 48 is not connected to the output Pumpout. Instead, the clamp circuit 48 is coupled to the oscillator circuit 46 where the internal nodes of the oscillator are clamped. This alternate clamping will be described in more detail in connection with FIG. 8.

Figure 7:
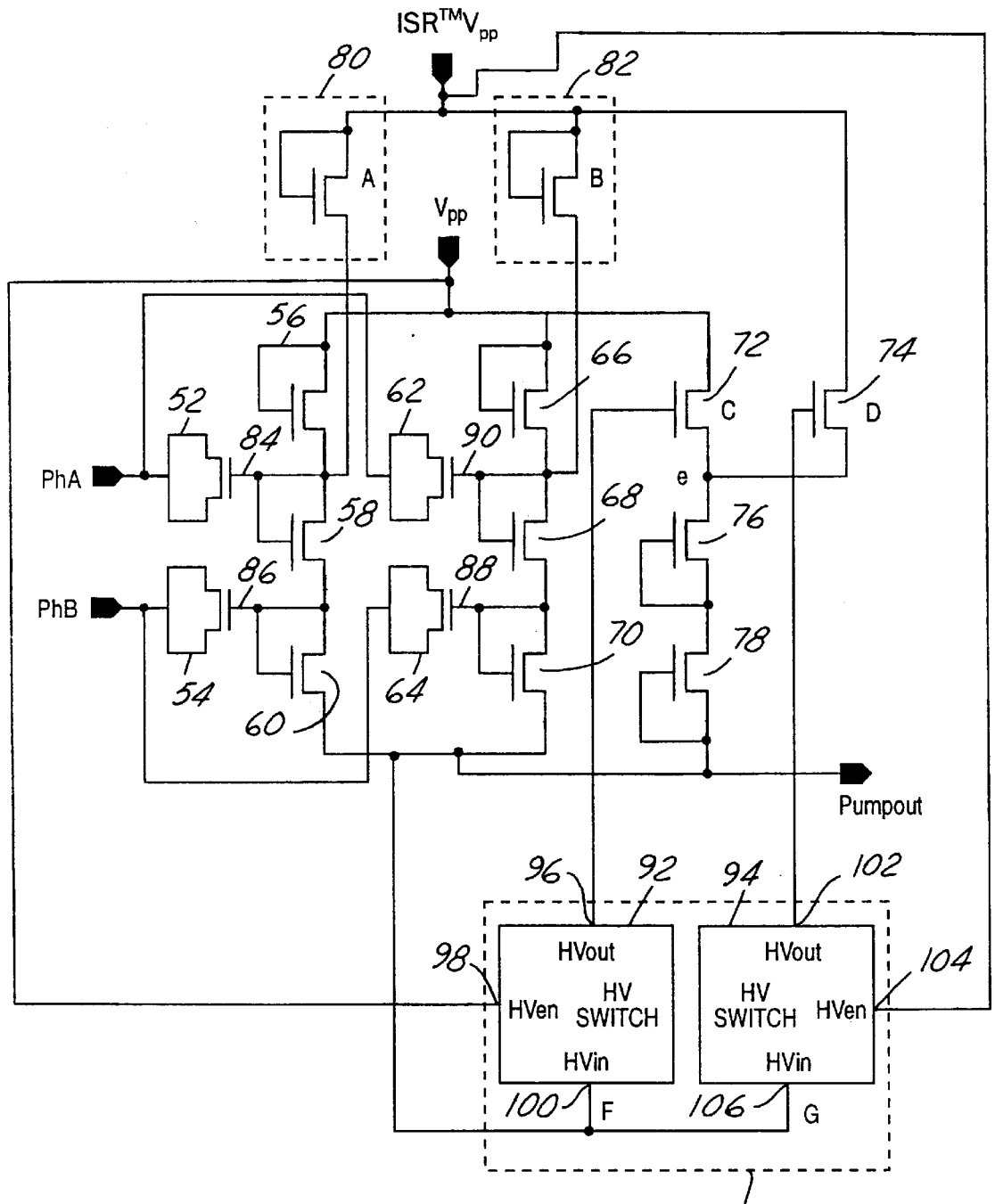
FIG. 7 is a detailed schematic diagram of the presently preferred embodiment illustrating multiple inputs and a single output.

Referring to FIG. 7, a circuit 50 is shown in accordance with the presently preferred embodiment of the invention. The circuit 50 generally comprises an input ISRVpp, (ISR™ is a trademark of Cypress Semiconductor Corporation, San Jose, Calif., referring to an in-system reprogrammable complex programmable logic device) an input Vpp, an input PhA, an input PhB, the output Pumpout, the input VPPen and the input ISRVPPen. (ISR™ is a trademark of Cypress Semiconductor Corporation, San Jose, Calif., referring to an in-system reprogrammable complex programmable logic device) The circuit 50 generally comprises a capacitively coupled transistor 52, a capacitively coupled transistor 54, a transistor 56, a transistor 58, a transistor 60, a capacitively coupled transistor 62, a capacitively coupled transistor 64, a transistor 66, a transistor 68, a transistor 70. Additionally, the circuit 50 comprises a C transistor 72, a D transistor 74, a transistor 76, a transistor 78, an A transistor 80 and a B transistor 82.

The transistor 52 receives an input PhA and presents an output 84 to the gate of the transistor 58 as well as to the drain of the transistor 58 and the drain of the transistor 56. The output 84 is also connected to the drain of the A transistor 80. The sources and drains of the transistors 56, 58 and 60 are cascaded together. The capacitively coupled transistor 54 receives an input PhB and presents an output 86 to the gate of the transistor 60 as well as to the source of the transistor 58 and the drain of the transistor 60. The input PhB is also presented to the capacitively coupled transistor 62. Similarly, the input PhA is also presented to the capacitively coupled transistor 64.

The drains and sources of the transistors 66, 68 and 70 are cascaded together. The capacitively coupled transistor 62 has an output 90 that is presented to the gate of the transistor 68, the drain of the transistor 66, and the drain of the transistor 68. The output 90 is also coupled to the drain of the B transistor 82. The capacitively coupled transistor 64 has an output 88 that is presented to both the gate and drain of the transistor 70 and the source of the transistor 68. The sources of the A transistor 80 and the B transistor 82 receive an input ISRVpp (ISR™ is a trademark of Cypress Semiconductor Corporation, San Jose, Calif., referring to an in-system reprogrammable complex programmable logic device). The sources of the transistor 56, the transistor 66 and the C transistor 72 each receive an input Vpp. The sources of the transistor 60, the transistor 70 and the drain of transistor 78 are coupled together and are presented to both the output Pumpout and to the HV switch block 57.

The HV switch block 57 comprises a high voltage switch 92 and a high voltage switch 94. The high voltage switch 92 has an output 96 that is coupled to the gate of the C transistor 72 and an input 98 that receives an input VPPen, and an input 100 that receives a signal F from the Pumpout. The high voltage switch 94 has an output 102 that is coupled to the gate of the D transistor 74. The high voltage switch 94 also has an input 104 that receives an input ISRVPPen (ISR™ is a trademark of Cypress Semiconductor Corporation, San Jose, Calif., referring to an in-system reprogrammable complex programmable logic device) and an input 106 that receives a signal G from the Pumpout.

The A transistor and the B transistor make up the second initialization circuit 42 of FIGS. 5 and 6. When the Vpp input is at a high voltage, the circuit 50 works in a similar fashion to the prior art scheme. When a high voltage is applied at the input ISRVpp, (ISR™ is a trademark of Cypress Semiconductor Corporation, San Jose, Calif., referring to an in-system reprogrammable complex programmable logic device) the A transistor 80 and the B transistor 82 are turned "on" and provide high voltage to the circuit 50. This forces the transistor 56 and the transistor 66 into an "off" state. The Vppen switches the C transistor 72 to an "off" state. The transistors 56 and 66 make up the first initialization circuit 44 of FIGS. 5 and 6. The transistors 76 and 78 provide a clamping path for the output Pumpout. The clamping path for the Pumpout is controlled by the C transistor 72 and the D transistor 74, which make up the multiplexer of the multiplexer/enable circuit 47 of FIGS. 5 and 6. When a high voltage is supplied to the input Vpp, the signal VPPen enables the high voltage switch 92, which turns on the C transistor 72 and allows the Vpp voltage to be passed to a node e. When the Vpp signal is high and the ISRVpp (ISR™ is a trademark of Cypress Semiconductor Corporation, San Jose, Calif., referring to an in-system reprogrammable complex programmable logic device) signal is low, the ISRVPPen (ISR™ is a trademark of Cypress Semiconductor Corporation, San Jose, Calif., referring to an in-system reprogrammable complex programmable logic device) signal disables the high voltage switch 94. This disables the D transistor 74 and disconnects it from the node e. Similarly, when the ISRVpp (ISR™ is a trademark of Cypress Semiconductor Corporation, San Jose, Calif., referring to an in-system reprogrammable complex programmable logic device) signal is high, the D transistor 74 is enabled and connected to the node e. This means the C transistor 72 is disabled and disconnected from the node e. This provides an appropriate clamp for the output Pumpout.

It should be appreciated that the transistors 56, 58 and 60, the transistors 66, 68 and 70 and the transistors 72 or 74, 76 and 78 provide three separate paths between the input Vpp and the output Pumpout as well as three independent paths between the input ISRVpp (ISR™ is a trademark of Cypress Semiconductor Corporation, San Jose, Calif., referring to an in-system reprogrammable complex programmable logic device) and the output Pumpout. If a greater amount of voltage increase is desired, the number of transistors in the clamping path (i.e., transistors 76 and 78) can be increased accordingly. The majority of the components of the circuit 50 are used for processing either the input ISRVpp (ISR™ is a trademark of Cypress Semiconductor Corporation, San Jose, Calif., referring to an in-system reprogrammable complex programmable logic device) or the input Vpp. Since the capacitively coupled transistors 52, 54, 62 and 64 are not duplicated, the circuit 50 generally reduces the chip real estate. All of the other support transistors take up much less chip real estate than the mentioned capacitively coupled transistors. Therefore efficient use of chip real estate is realized, which is a paramount design criteria in modern memory implementations. If more than two inputs are required, additional HV switches 92 and 94 may be implemented. The number of HV switches 92 and 94 will equal the number of discrete voltage inputs presented to the circuit 50.

Figure 8:
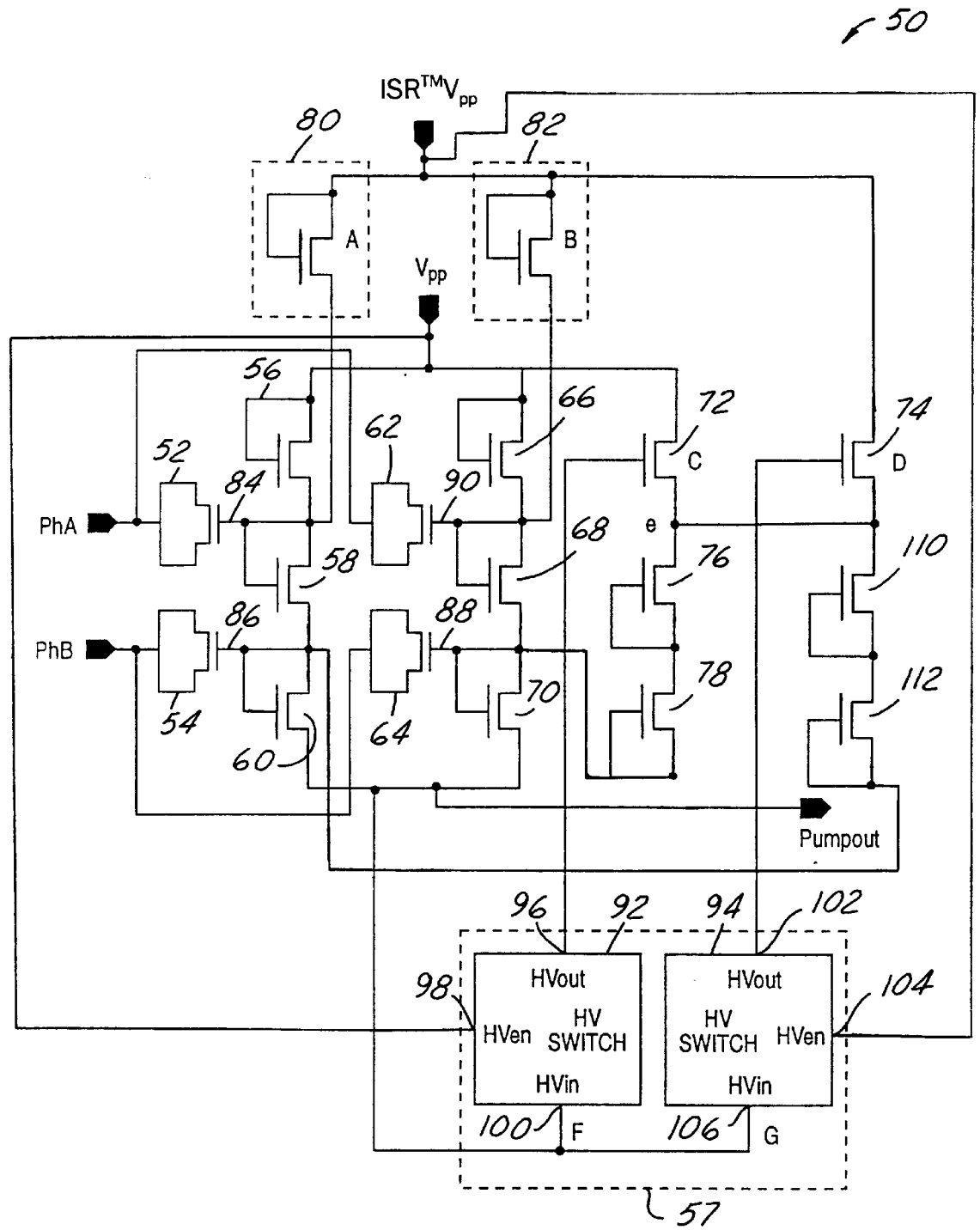
FIG. 8 is a detailed schematic diagram of the alternate clamping configuration shown in FIG. 6.

Referring to FIG. 8, the clamping path through transistors 76 and 78 can be moved to the node between 58 and 60, 68 and 70 by eliminating the node between the transistor 72 and the output Pumpout. This would be one of the alternate implementations shown in FIG. 6 in which internal node of the pump is clamped. Additional transistors 110 and 112 are also shown.

It is to be understood that modifications to the invention might occur to one with skill in the field of the invention within the scope of the appended claims.

I claim:

1. A circuit comprising:

voltage increasing means for presenting a pump output in response to: (i) one of a plurality of inputs each having a different level and (ii) an output signal, wherein said one of said inputs is increased by a predetermined voltage in response to said output signal wherein said voltage increasing means comprises a plurality of voltage paths each comprising one or more diodes and providing an independent voltage increase to one of said plurality of inputs as determined by the number of said one or more diodes in each path, wherein each of said number of said independent voltages has a different number of said one or more diodes;

switching means for presenting said output signal in response to a threshold level at one of said plurality of inputs; and at least one phase oscillator output coupled to said voltage increasing means for providing said predetermined voltage increase.

2. The circuit according to claim 1 further comprising a second phase oscillator input coupled to said voltage increasing means.

3. The circuit according to claim 1 wherein each of said plurality of inputs has an independent magnitude of voltage increase.

4. The circuit according to claim 1 wherein said diodes comprise transistors having a drain or a source coupled to a gate.

5. The circuit according to claim 1 wherein at least one of said plurality of voltage paths comprises a clamping path comprising one or more transistors, wherein said clamping path limits said voltage present at said pump output to a predetermined clamping voltage.

6. The circuit according to claim 5 wherein said predetermined clamping voltage is determined by the number of transistors in said clamping path.

7. The circuit according to claim 1 wherein said one or more diodes comprise a transistor having a source or a drain coupled to a gate.

8. The circuit of claim 1 wherein said pump output has one of a plurality of voltage levels.

9. A circuit comprising:

(a) a pump configured (i) to receive a plurality of voltage inputs having different voltage levels and (ii) present an output;

(b) a clamp path configured to receive said output; and (c) a circuit configured to couple one of said plurality of voltage inputs to said clamp path in response to a threshold voltage at one of said plurality of voltage inputs.

10. The circuit of claim 9 wherein said circuit configured to couple one of said plurality of voltage inputs to said clamp path comprises a switch.

11. The circuit of claim 9 wherein said circuit configured to couple one of said plurality of voltage inputs to said clamp path comprises an enable circuit that automatically configures said pump in response to said threshold voltage at one of said plurality of voltage inputs.

12. The circuit of claim 9 wherein said circuit configured to couple one of said plurality of voltage inputs to said clamp path comprises a multiplexer receiving a control signal generated in response to one of said plurality of voltage inputs.

13. The circuit of claim 9 wherein said plurality of voltage inputs comprise first and second voltage inputs respectively coupled to first and second capacitive devices.

14. The circuit of claim 13 further comprising an oscillator input coupled to said first and second capacitive devices.

15. The circuit of claim 9 wherein said one or more pump paths comprises first and second pump paths respectively coupled to first and second capacitive devices.

16. The circuit of claim 15 further comprising an oscillator input coupled to said first and second capacitive devices.

17. The circuit of claim 16 wherein said first and second pump paths further comprise a second oscillator input coupled to third and fourth capacitive devices, said third and fourth capacitive devices being respectively coupled in parallel with said first and second capacitive devices.

18. The circuit of claim 9 wherein said pump is configured to increase at least two of said voltage levels.

19. The circuit of claim 9 wherein said output has one of a plurality of voltage levels.

20. The circuit of claim 10 wherein said circuit configured to couple one of said plurality of voltage inputs to said clamp path comprises a plurality of switches, the number of switches being equal to the number of voltage inputs.

* * * * *